US010917056B2

(12) United States Patent
Lehtola et al.

(10) Patent No.: US 10,917,056 B2
(45) Date of Patent: *Feb. 9, 2021

(54) DEVICES AND METHODS FOR POWER AMPLIFICATION WITH SHARED COMMON BASE BIASING

(71) Applicant: SKYWORKS SOLUTIONS, INC., Woburn, MA (US)

(72) Inventors: Philip John Lehtola, Cedar Rapids, IA (US); David Steven Ripley, Marion, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/458,026

(22) Filed: Jun. 29, 2019

(65) Prior Publication Data

US 2020/0162039 A1 May 21, 2020

Related U.S. Application Data

(63) Continuation of application No. 15/653,520, filed on Jul. 18, 2017, now Pat. No. 10,340,862, which is a
(Continued)

(51) Int. Cl.
*H03F 1/22* (2006.01)
*H03F 3/21* (2006.01)
(Continued)

(52) U.S. Cl.
CPC .......... *H03F 3/211* (2013.01); *H03F 1/0261* (2013.01); *H03F 1/22* (2013.01); *H03F 1/565* (2013.01);
(Continued)

(58) Field of Classification Search
CPC . H03F 3/211; H03F 3/245; H03F 3/24; H03F 3/72; H03F 1/22; H03F 1/0261;
(Continued)

(56) References Cited

U.S. PATENT DOCUMENTS 5,227,734 A 7/1993 Schindler et al.
6,297,694 B1 10/2001 Yamamoto
(Continued)

FOREIGN PATENT DOCUMENTS

CN 1327348 12/2001
CN 1481609 3/2004
(Continued)

OTHER PUBLICATIONS 201510634235.0, Power Amplification System With Shared Common Base Biasing, filed Sep. 29, 2015.
(Continued)

*Primary Examiner* — Khanh V Nguyen
(74) *Attorney, Agent, or Firm* — Chang & Hale LLP

(57) ABSTRACT

A power amplification system with shared common base biasing is disclosed. A method for power amplification at a controller of a power amplification system comprising a plurality of cascode amplifier sections can include receiving a band select signal indicative of one or more frequency bands of a radio-frequency input signal to be amplified and transmitted. The method may further include biasing a common base stage of each of the plurality of cascode amplifier sections, and biasing a common emitter stage of a subset of the plurality of cascode amplifier sections.

20 Claims, 7 Drawing Sheets

Related U.S. Application Data continuation of application No. 14/867,216, filed on Sep. 28, 2015, now Pat. No. 9,712,125.

(60) Provisional application No. 62/116,497, filed on Feb. 15, 2015.

(51) Int. Cl.
*H03F 1/02* (2006.01)
*H03F 1/56* (2006.01)
*H03F 3/191* (2006.01)
*H03F 3/24* (2006.01)
*H03F 3/72* (2006.01)
*H04B 1/04* (2006.01)

(52) U.S. Cl.
CPC ............... *H03F 3/191* (2013.01); *H03F 3/24* (2013.01); *H03F 3/245* (2013.01); *H03F 3/72* (2013.01); *H03F 1/223* (2013.01); *H03F 2200/111* (2013.01); *H03F 2200/294* (2013.01); *H03F 2200/451* (2013.01); *H03F 2203/21103* (2013.01); *H03F 2203/21106* (2013.01); *H03F 2203/7209* (2013.01); *H04B 2001/0408* (2013.01)

(58) Field of Classification Search
CPC .... H03F 3/191; H03F 1/565; H03F 2200/451; H03F 1/223; H03F 2200/111; H03F 2203/7209; H03F 2200/294; H03F 2203/21103; H03F 2203/21106; H03F 3/602; H03F 3/604; H03F 1/0288; H04B 2001/0408
USPC ...................................... 330/124 R, 295, 311
See application file for complete search history.

(56) References Cited

U.S. PATENT DOCUMENTS

| | | | |
|---|---|---|---|
| 7,023,272 B2 | 4/2006 | Hung et al. | |
| 7,446,604 B2 | 11/2008 | Yeh | |
| 7,474,158 B1 | 1/2009 | Yim et al. | |
| 7,486,135 B2 | 2/2009 | Mu | |
| 7,701,289 B2 | 4/2010 | Kuo et al. | |
| 7,746,590 B2 | 6/2010 | Fischer | |
| 8,150,343 B2 | 4/2012 | Ramachandra Reddy | |
| 8,319,556 B2 | 11/2012 | Comeau et al. | |
| 8,487,698 B2 | 7/2013 | Nakamura et al. | |
| 8,665,016 B2 | 3/2014 | Chowdhury et al. | |
| 9,369,100 B2 | 6/2016 | Tatsumi | |
| 2012/0326792 A1* | 12/2012 | Wang .................. | H04B 1/1036 330/296 |
| 2014/0112213 A1 | 4/2014 | Norholm et al. | |
| 2014/0197893 A1 | 7/2014 | Knopik | |
| 2014/0266460 A1 | 9/2014 | Nobbe et al. | |
| 2014/0333374 A1 | 11/2014 | Tatsumi | |

FOREIGN PATENT DOCUMENTS

| | | |
|---|---|---|
| CN | 1550063 | 11/2004 |
| CN | 1552121 | 12/2004 |
| CN | 1870422 | 11/2006 |
| CN | 1918786 | 2/2007 |
| CN | 101656515 | 2/2010 |
| JP | 2002-217648 | 8/2002 |
| JP | 2005-217557 | 8/2005 |
| JP | 2005-269525 | 9/2005 |
| JP | 2005-312016 | 11/2005 |
| JP | 2007-259297 | 10/2007 |
| JP | 2009-010826 | 1/2009 |
| JP | 2012-170031 | 9/2012 |
| JP | 2012-521670 | 9/2012 |
| JP | 2014-175675 | 9/2014 |
| KR | 1020130109384 | 10/2013 |
| TW | 201414190 | 4/2014 |
| WO | 2013/137291 | 9/2013 |
| WO | 2016/035166 | 3/2016 |

OTHER PUBLICATIONS 201810907444.1, Methods for Power Amplification With Shared Common Base Biasing, filed Aug. 10, 2018.
102015218853.1, Power Amplification System With Shared Common Base Biasing, filed Sep. 30, 2015.
16114281.1, Power Amplification System With Shared Common Base Biasing, filed Dec. 15, 2016.
19120437.9, Methods For Power Amplification With Shared Common Base Biasing, filed Mar. 5, 2019.
2015-192539, Power Amplification System With Shared Common Base Biasing, filed Sep. 30, 2015.
10-2015-0137832, Power Amplification System With Shared Common Base Biasing, filed Sep. 30, 2015.
104132326, Power Amplification System With Shared Common Base Biasing, filed Sep. 30, 2015.

* cited by examiner

DEVICES AND METHODS FOR POWER AMPLIFICATION WITH SHARED COMMON BASE BIASING

CROSS-REFERENCE TO RELATED APPLICATION(S)

This application is a continuation of U.S. patent application Ser. No. 15/653,520, filed Jul. 18, 2017, entitled "METHODS FOR POWER AMPLIFICATION WITH SHARED COMMON BASE BIASING," which is a continuation of U.S. patent application Ser. No. 14/867,216, filed Sep. 28, 2015, entitled "POWER AMPLIFICATION SYSTEM WITH SHARED COMMON BASE BIASING," which claims priority to U.S. Provisional Application No. 62/116,497, filed Feb. 15, 2015, entitled "COMMON CASCODE BASE BIASING," the disclosure of each of which is hereby expressly incorporated by reference herein in its entirety.

BACKGROUND

Field

The present disclosure generally relates to power amplifiers.

Description of the Related Art

A power amplification system can include a number of power amplifier stages corresponding to a plurality of frequency bands. Biasing each of the power amplifier stages, particularly when each stage includes multiple transistors, can include duplicative bias circuitry, control circuitry, and corresponding routing.

SUMMARY

In accordance with some implementations, the present disclosure relates to a power amplification system. The power amplification system includes a plurality of cascode amplifier sections. Each one of the plurality of cascode amplifier sections including a first transistor and a second transistor. The power amplification system includes a plurality of common emitter biasing components. Each one of the plurality of common emitter biasing components is coupled to a base of the first transistor of a respective one of the plurality of cascode amplifier sections and is controllable to bias the first transistor of the respective one of the plurality of cascode amplifier sections. The power amplification includes a common base biasing component coupled to a base of the second transistor of each of the plurality of cascode amplifier sections and controllable to bias the second transistor of each of the plurality of cascode amplifier sections.

In some embodiments, the power amplification system can further include a controller configured to control the plurality of common emitter biasing components based on a band select signal. In some embodiments, the controller can be configured to, based on the band select signal, enable one or more of the plurality of common emitter biasing components to provide a respective first biasing signal to the base of the first transistor of a respective one or more of the plurality of cascode amplifier sections. In some embodiments, the controller can be configured to, irrespective of the band select signal, enable the common base biasing component to provide a second biasing signal to the bases of the second transistors of each of the plurality of cascode amplifier sections.

In some embodiments, the first biasing signals can be based on a target output power. In some embodiments, the second biasing signal can be based on a target output power.

In some embodiments, the second biasing signal can be derived from a current source coupled to the common base biasing component and powered by voltage from a battery. In some embodiments, the first biasing signals can be derived from respective current sources coupled to the one or more of the plurality of common emitter biasing components and powered by voltage from a battery.

In some embodiments, the power amplification system can further include a plurality of RC decoupling components. Each of the RC decoupling components can include a resistor coupled between the common base biasing component and the base of the second transistor of a respective one of the plurality of cascode amplifier sections and can further include a capacitor coupled between the base of the second transistor of the respective one of the plurality of cascode amplifier sections and a ground voltage.

In some embodiments, a collector of the second transistor of each of the plurality of first transistors can be coupled to a supply voltage via a respective inductor.

In some embodiments, a collector of the second transistor of each of the plurality of first transistors can be coupled to an antenna switch component via a respective output matching and filtering component. In some embodiments, each of the plurality of output matching and filtering components can correspond to a respective one of a plurality of frequency bands. In some embodiments, each of the plurality of matching and filtering components can be configured to filter an output RF signal with a filter centered at a respective one of a plurality of frequency bands.

In some embodiments, the antenna switch component can be configured to output the signal received at a selected one of the plurality of output matching and filtering components. In some embodiments, the antenna switch component can be configured to combine and output the signals received at a plurality of the plurality of output matching and filtering components.

In some embodiments, the power amplification system can further include a plurality of input matching components coupled to the base of the first transistor of a respective one of the plurality of cascode amplifier sections and configured to match an input RF signal at a respective one of a plurality of frequency bands.

In some embodiments, the power amplification system can further include a plurality of RC decoupling components. Each one of the RC decoupling components can include a resistor coupled between a respective common emitter biasing component and the base of the first transistor of a respective one of the plurality of cascode amplifier sections and further including a capacitor coupled between the base of the second transistor of the respective one of the plurality of cascode amplifier sections and a respective one of the plurality of input matching components.

In some implementations, the present disclosure relates to a radio-frequency (RF) module including a packaging substrate configured to receive a plurality of components. The RF module includes a power amplification system implemented on the packaging substrate. The power amplification system includes a plurality of cascode amplifier sections. Each one of the plurality of cascode amplifier sections includes a first transistor and a second transistor. The power amplification system includes a plurality of common emitter biasing components. Each one of the plurality of common emitter biasing components is coupled to a base of the first transistor of a respective one of the plurality of cascode amplifier sections and is controllable to bias the first transistor of the respective one of the plurality of cascode amplifier sections. The power amplification system includes a common base biasing component coupled to a base of the second transistor of each of the plurality of cascode amplifier sections and controllable to bias the second transistor of each of the plurality of cascode amplifier sections.

In some embodiments, the RF module can be a front-end module (FEM).

In some implementations, the present disclosure relates to a wireless device including a transceiver configured to generate a radio-frequency (RF) signal. The wireless device includes a front-end module (FEM) in communication with the transceiver. The FEM includes a packaging substrate configured to receive a plurality of components. The FEM further includes a power amplification system implemented on the packaging substrate. The power amplification system includes a plurality of cascode amplifier sections. Each one of the plurality of cascode amplifier sections includes a first transistor and a second transistor. The power amplification system includes a plurality of common emitter biasing components. Each one of the plurality of common emitter biasing components is coupled to a base of the first transistor of a respective one of the plurality of cascode amplifier sections and is controllable to bias the first transistor of the respective one of the plurality of cascode amplifier sections. The power amplification system includes a common base biasing component coupled to a base of the second transistor of each of the plurality of cascode amplifier sections and controllable to bias the second transistor of each of the plurality of cascode amplifier sections. The wireless device includes an antenna in communication with the FEM. The antenna is configured to transmit an amplified version of the RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
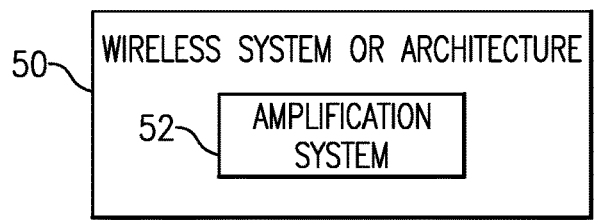
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
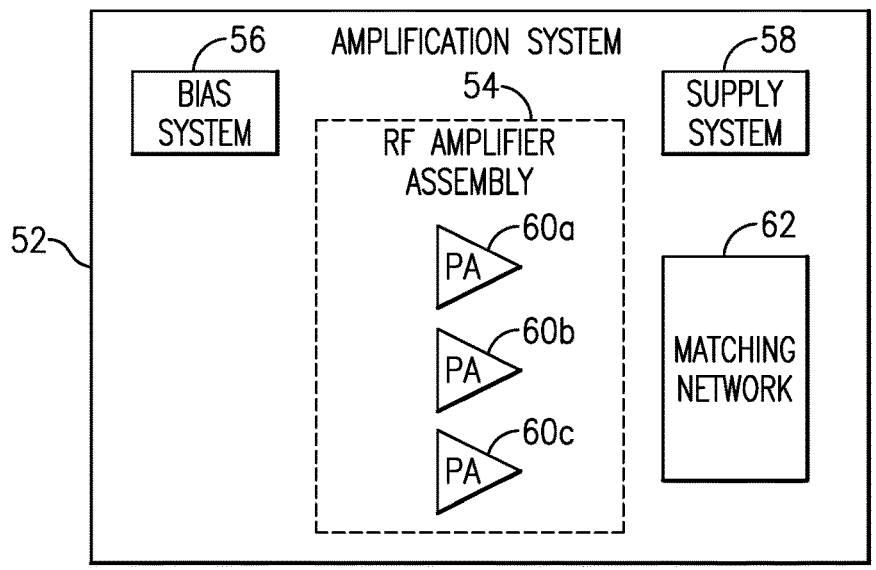
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
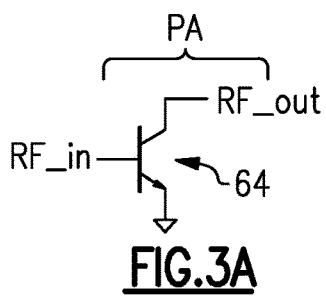
FIGS. 3A-3E show non-limiting examples of power amplifiers.

For the purpose of description, it will be understood that each PA (60a-60c) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
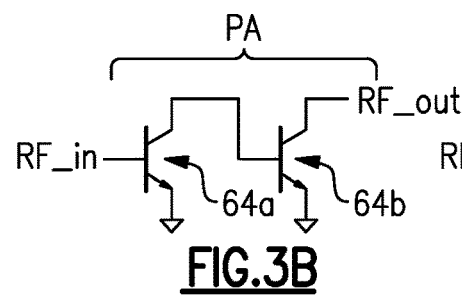

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
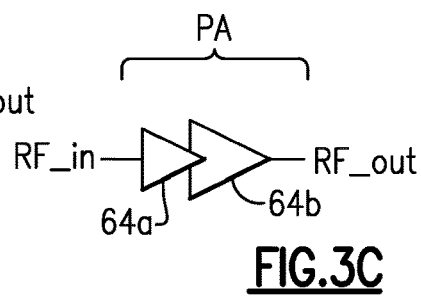

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
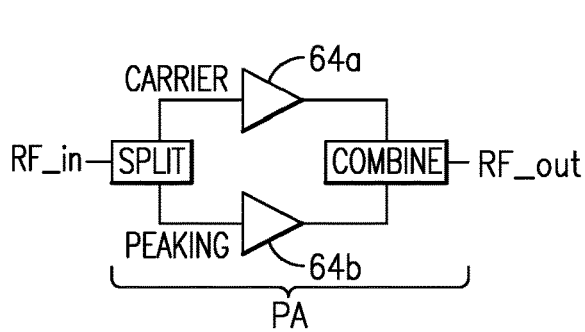

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
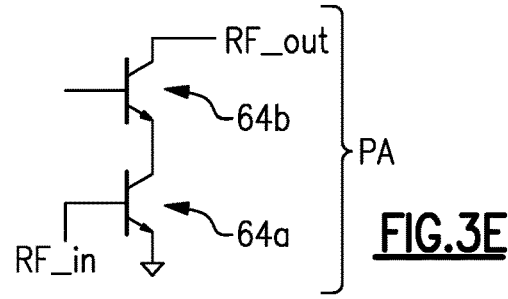

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
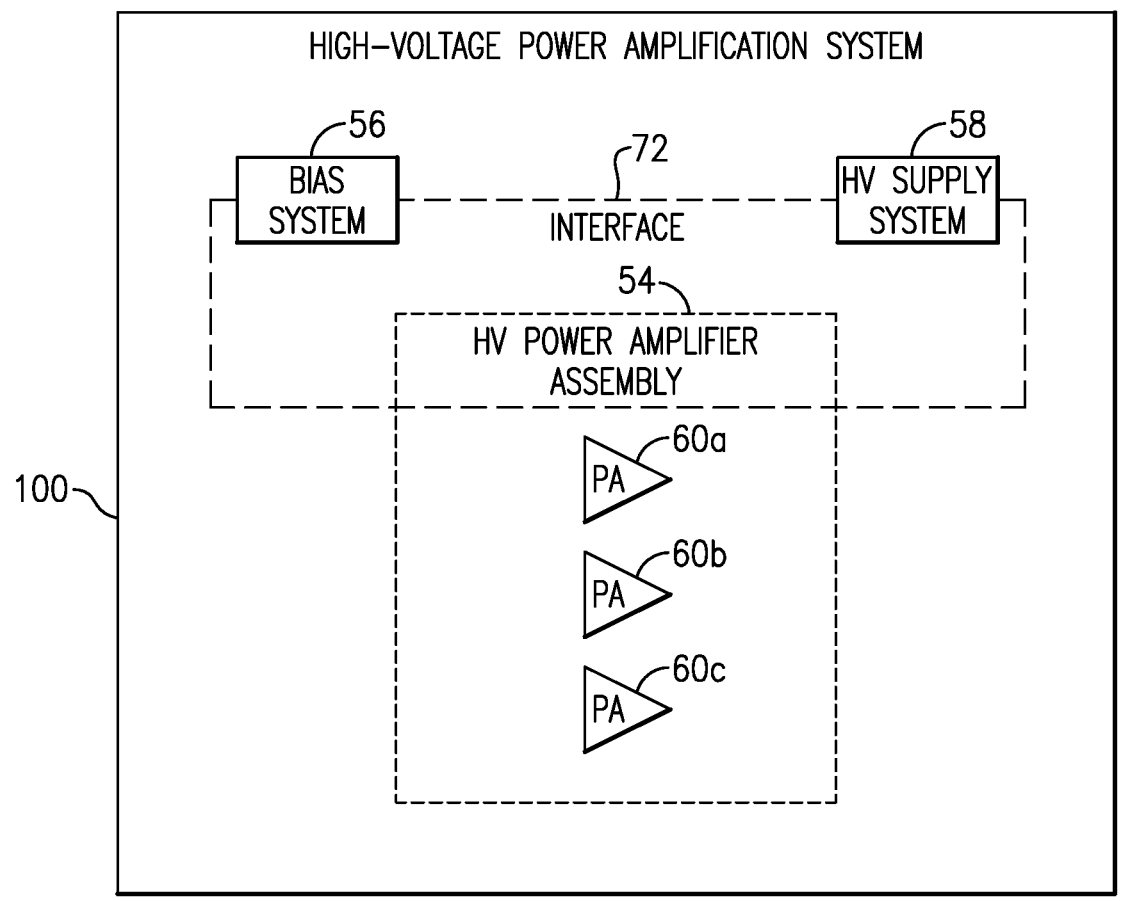
FIG. 4 shows that, in some implementations, an amplification system can be implemented as a high-voltage (HV) power amplification system.

FIG. 4 shows that in some embodiments, the amplification system 52 of FIG. 2 can be implemented as a high-voltage (HV) power amplification system 70. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Parallel amplifier chains, e.g., a plurality of power amplification sub-systems corresponding to a plurality of frequency bands, may employ independent bias controls for each signal path of the chain. Such a system may include duplication of bias circuitry and multiple interface lines to support multiple amplifiers within a single module. For example, a system may include a separate bias current buffer and control interface for each of a plurality of power amplification sub-system sections.

Described herein is a power amplification system including multiple gain stages that share a common bias line and bias current buffer circuit to provide a bias to a common base cascode stage of each gain stage. Inactive amplifiers (or power amplification sub-system sections) are disabled (or not enabled) by elimination of the reference current for the respective common emitter cascode stage of the inactive amplifier, even while the common base cascode stage remains biased. As described further below, the power amplification system may further include RC decoupling at each amplifier to provide isolation of the shared amplifier sections.

Figure 5:
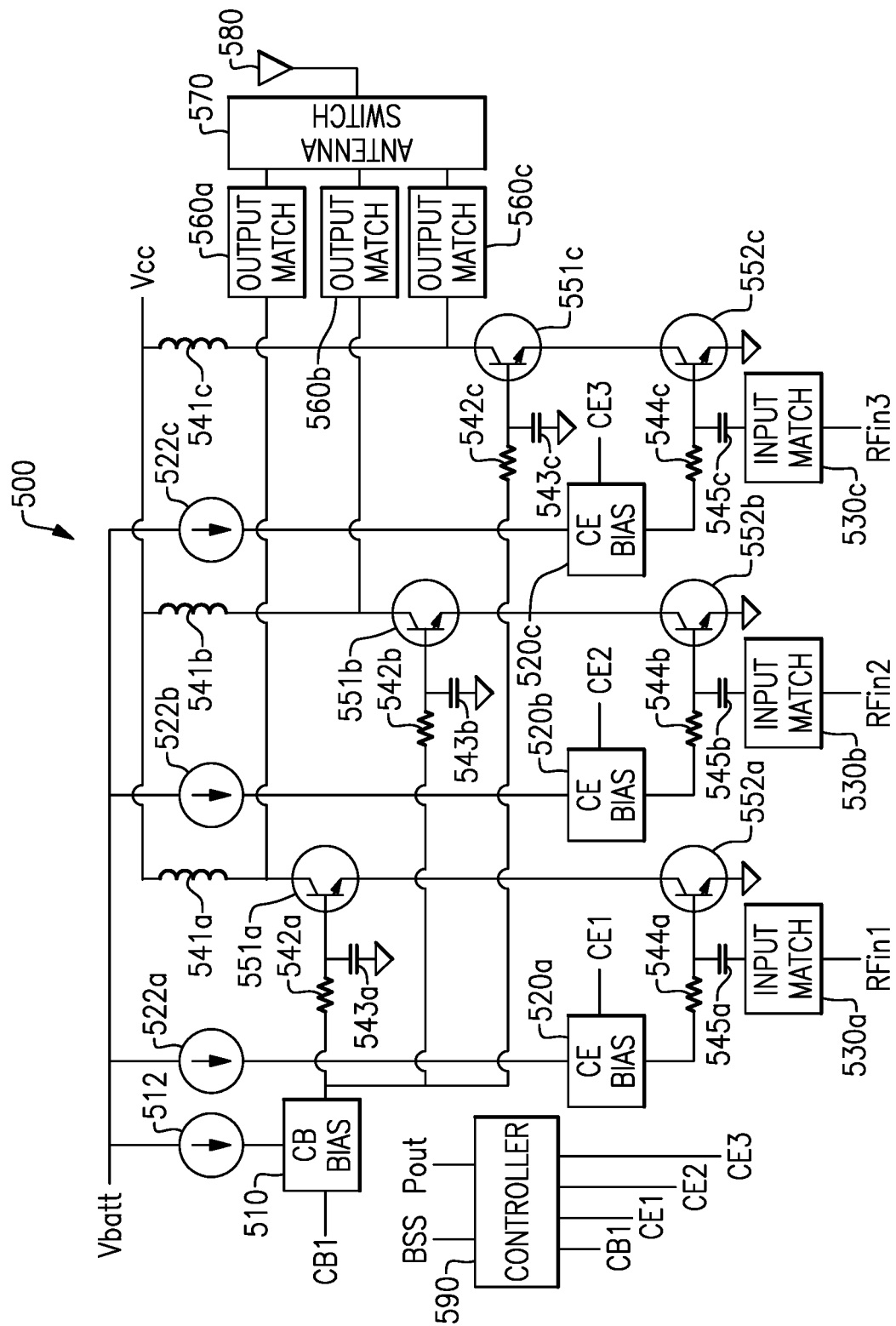
FIG. 5 shows that, in some embodiments, a power amplification system may include a plurality of cascode amplifier sections.

FIG. 5 shows that, in some embodiments, a power amplification system 500 may include a plurality of cascode amplifier sections. Although FIG. 5 illustrates three cascode amplifier sections, it is to be appreciated that the power amplification system 500 may include any number of cascode amplifier sections, such as two, three, four, or more cascode amplifier sections. Each cascode amplifier section includes a common emitter stage including a first transistor 552a-552c and a common base stage including a second transistor 551a-551c.

The base of each first transistor 552a-552c is coupled, via an RC decoupling component, to a respective common emitter biasing component 520a-520c and a respective input matching component 530a-530c. In some implementations, each input matching component 530a-530c is configured to match an input RF signal (or input signal frequency component) at a respective one of a plurality of frequency bands. In particular, each RC decoupling component includes a resistor 544a-544c coupled between the base of the first transistor 552a-552c and the common emitter biasing component 520a-520c and further includes a capacitor 545a-545c coupled between the base of the first transistor 552a-552c and the input matching component 530a-530c. The drain of each first transistor 552a-552c is coupled to a ground potential.

The base of each second transistor 551a-551c is coupled, via an RC decoupling component, to a shared common base biasing component 510 and the ground potential. In particular, each RC decoupling component includes a resistor 542a-542c coupled between the base of the second transistor 551a-551c and the common base biasing component 510 and further includes a capacitor 543a-543c coupled between the base of the second transistor 551a-551c and the ground potential.

The collector of each second transistor 551a-551c is coupled, via a respective inductor 541a-541c to a supply voltage (Vcc). In some implementations, the supply voltage is derived from a battery voltage (Vbatt) and may be greater or less than the battery voltage. The supply voltage may be supplied by a power management system (as described below with respect to FIGS. 9 and 10. The collector of each second transistor 551a-551c is further coupled, via a respective output matching and filtering component 560a-560c to an antenna switch component 570. In some implementations, each of the output matching and filtering components 560a-560c correspond to a respective one of a plurality of frequency bands. In some implementations, each of the output matching and filtering components 560a-560c is configured to filter an output RF signal with a filter centered at a respective one of the plurality of frequency bands.

In some implementations, for single-band transmission, the antenna switch component 570 is configured to output (e.g., to an antenna 580) the signal received at a selected one of the plurality of output matching and filtering components 560a-560c, e.g., as indicated by a band select signal. In some implementations, for multi-band transmission (e.g., carrier aggregation), the antenna switch component 570 is configured to combine and output (e.g., to the antenna 580) the signals received at a plurality of the output matching and filtering components 560a-560c, e.g., as indicated by the band select signal.

Each of the common emitter biasing components 520a-520c is controllable to bias the first transistor 552a-552c of a respective one of the plurality of cascode amplifier sections. The common base biasing component 510 is controllable to bias the second transistor 551a-551c of each of the plurality of cascode amplifier sections. To that end, the power amplification system 500 includes a controller 590 configured to control the common emitter biasing components 520a-520c and the common base biasing component 510.

The controller 590 receives a band select signal (BSS) indicative of one or more frequency bands of an input signal that is to be amplified by the power amplification system

500. In response, the controller 590 generates control signals (CB1, CE1, CE2, CE3) to enable a respective one or more cascode amplifier sections (and not enable the others of the cascode amplifier sections).

For example, if the band select signal indicates that the input signal includes only a second frequency band corresponding to the second cascode amplifier section including transistors 551*b* and 552*b* (and thus, includes only one frequency component corresponding to RFin2), the controller 590 generates a common base biasing component control signal CB1 to bias each of the second transistors 551*a*-551*c* and respective common emitter biasing component control signals CE1-CE3 to not bias the first transistor 552*a* of the first cascode amplifier section, to bias the first transistor 552*b* of the second cascode amplifier section, and to not bias the first transistor 552*c* of the third cascode amplifier section.

In response to receiving the common emitter biasing component control signals CE2 to bias the first transistor 552*b* of the second cascode amplifier section, the second common emitter biasing component 520*b* generates a first biasing signal and provides the first biasing signal to the base of the first transistor 552*b* of the second cascode amplifier section. The first biasing signal may be a bias voltage or a bias current.

In response to receiving the common base biasing component control signal CB1 to bias each of the second transistors 551*a*-551*c*, the common base biasing component 510 generates a second biasing signal and provides the second biasing signal to the base of each of the second transistors 551*a*-551*c*. The biasing signal may be a bias voltage or a bias current.

The first biasing signal and the second biasing signal may be derived from respective current sources 512, 522*a*-522*c* powered by voltage from a battery (Vbatt) and respectively coupled to the common base biasing component 510 and common emitter biasing components 520*a*-520*c*.

In some implementations, the first biasing signal (or signals) and second biasing signal are based on a target output power. A signal indicative of the target output power (Pout) can be received by the controller 590 and the control signals can control the biasing components to generate the biasing signals based on the target output power.

Thus, the power amplification system 500 includes a plurality of cascode amplifier sections, each one of the plurality of cascode amplifier sections including a first transistor 552*a*-552*c* (or common emitter transistor) and a second transistor 551*a*-551*c* (or common base transistor). The power amplification system 500 further includes a plurality of common emitter biasing components 520*a*-520*c*, each one of the common emitter biasing components 520*a*-520*c* coupled to a base of the first transistor 552*a*-552*c* of a respective one of the plurality of cascode amplifier sections and controllable (e.g., by the controller 590) to bias the first transistor 552*a*-552*c* of the respective one of the plurality of cascode amplifier sections. The power amplification system further includes a common base biasing component 510 coupled to a base of the second transistor 551*a*-551*c* of each of the plurality of cascode amplifier sections and controllable to bias the second transistor 551*a*-551*c* of each of the plurality of cascode amplifier sections.

As shown in FIG. 5, in some implementations, the power amplifier system 500 includes only a single common base biasing component 510. Thus, buffer circuit area and signal routing may be advantageously reduced. Further, as the common base bias voltage can be active, even for non-active cascode amplifier sections, isolation may be improved.

As described above, the power amplification system 500 further includes a controller 590 configured to control the plurality of common emitter biasing 520*a*-520*c* components based on a band select signal. For example, the controller 590 can be configured to, based on the band select signal, enable one or more of the plurality of common emitter biasing components 520*a*-520*c* to provide a respective first biasing signal to the base of the first transistor 552*a*-552*c* of a respective one or more of the plurality of cascode amplifier sections. The controller can further be configured to, irrespective of the band select signal, enable the common base biasing component 510 to provide a second biasing signal to the bases of the second transistors 551*a*-511*c* of each of the plurality of cascode amplifier sections.

Figure 6:
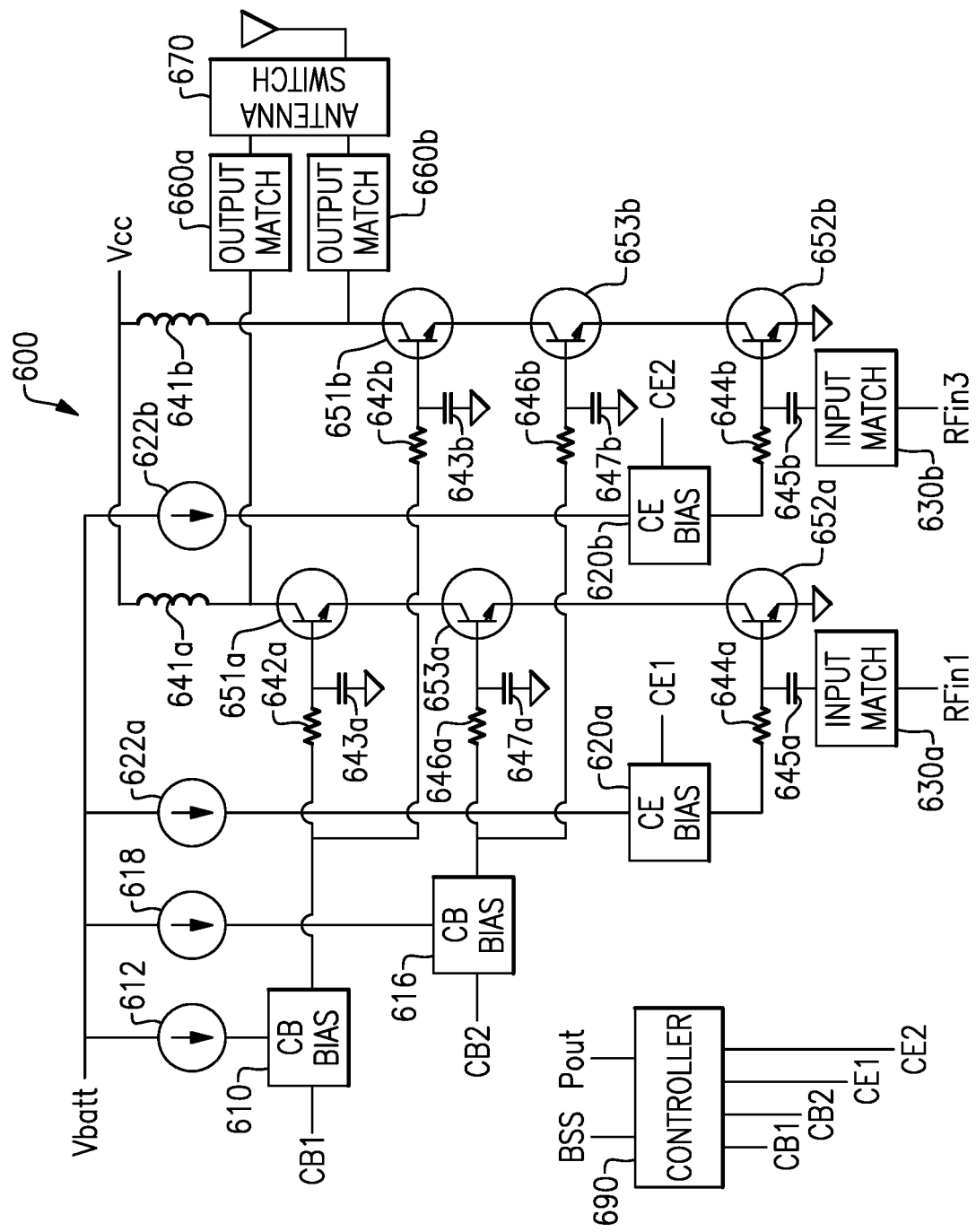
FIG. 6 shows that, in some embodiments, a power amplification system can have a plurality of shared common base biasing components.

FIG. 6 shows that, in some embodiments, a power amplification system 600 can have a plurality of shared common base biasing components. Although FIG. 6 illustrates two cascode amplifier sections, it is to be appreciated that the power amplification system 600 may include any number of cascode amplifier sections, such as two, three, four, or more cascode amplifier sections. Further, although FIG. 6 illustrates each cascode amplifier section as including three transistors, it is to be appreciated that each cascode amplifier section may include any number of transistors, such as two, three, four, or more transistors. Each cascode amplifier section includes a common emitter stage including a first transistor 652*a*-652*b* and a common base stage including a second transistor 651*a*-651*b* and a third transistor 653*a*-653*b*.

The base of each first transistor 652*a*-652*b* is coupled, via an RC decoupling component, to a respective common emitter biasing component 620*a*-620*b* and a respective input matching component 630*a*-630*b*. In particular, each RC decoupling component includes a resistor 644*a*-644*b* coupled between the base of the first transistor 652*a*-652*b* and the common emitter biasing component 620*b*-620*b* and further includes a capacitor 645*a*-645*b* coupled between the base of the first transistor 652*a*-652*b* and the input matching component 630*a*-630*b*. The drain of each first transistor 652*a*-652*b* is coupled to a ground potential.

The base of each second transistor 651*a*-651*b* is coupled, via an RC decoupling component, to a first shared common base biasing component 610 and the ground potential. In particular, each RC decoupling component includes a resistor 642*a*-642*b* coupled between the base of the second transistor 651*a*-651*b* and the first common base biasing component 610 and further includes a capacitor 643*a*-643*b* coupled between the base of the second transistor 651*a*-651*b* and the ground potential.

The collector of each second transistor 651*a*-651*b* is coupled, via a respective inductor 641*a*-641*b* to a supply voltage (Vcc). The collector of each second transistor 651*a*-651*b* is further coupled, via a respective output matching and filtering component 660*a*-660*b* to an antenna switch component 670.

The base of each third transistor 653*a*-653*b* is coupled, via an RC decoupling component, to a second shared common base biasing component 616 and the ground potential. In particular, each RC decoupling component includes a resistor 646*a*-646*b* coupled between the base of the third transistor 653*a*-653*b* and the second common base biasing component 616 and further includes a capacitor 647*a*-647*b* coupled between the base of the third transistor 653*a*-653*b* and the ground potential.

The common emitter biasing components 620*a*-620*b* are controllable to bias the first transistor 652*a*-652*b* of a respective one of the plurality of cascode amplifier sections.

The first common base biasing component 610 is controllable to bias the second transistor 651a-651b of each of the plurality of cascode amplifier sections. The second common base biasing component 616 is controllable to bias the third transistor 653a-653b of each of the plurality of cascode amplifier sections. To that end, the power amplification system 600 includes a controller 690 configured to control the common emitter biasing components 620a-620b and the common base biasing components 610, 616.

The controller 690 receives a band select signal (BSS) indicative of one or more frequency bands of an input signal that is to be amplified by the power amplification system 600. In response, the controller 690 generates control signals (CB1, CB2, CE1, CE2) to enable a respective one or more cascode amplifier sections (and not enable the others of the cascode amplifier sections).

For example, if the band select signal indicates that the input signal includes only a second frequency band corresponding to the second cascode amplifier section including transistors 651b, 652b, and 653b (and thus, includes only one frequency component corresponding to RFin2), the controller 690 generates a first common base biasing component control signal CB1 to bias each of the second transistors 651a-651b, a second common base biasing component control signal CB2 to bias each of the third transistors 653a-653b, and respective common emitter biasing component controls signals CE1-CE2 to not bias the first transistor 652a of the first cascode amplifier section and to bias the first transistor 652b of the second cascode amplifier section.

In response to receiving the common emitter biasing component control signals CE2 to bias the first transistor 652b of the second cascode amplifier section, the second common emitter biasing component 620b generates a first biasing signal and provides the first biasing signal to the base of the first transistor 652b of the second cascode amplifier section. The first biasing signal may be a bias voltage or a bias current.

In response to receiving the first common base biasing component control signal CB1 to bias each of the second transistors 651a-651b, the first common base biasing component 610 generates a second biasing signal and provides the second biasing signal to the base of each of the second transistors 651a-651b. The biasing signal may be a bias voltage or a bias current.

In response to receiving the second common base biasing component control signal CB2 to bias each of the third transistors 653a-653b, the second common base biasing component 616 generates a third biasing signal and provides the third biasing signal to the base of each of the third transistors 653a-653b. The biasing signal may be a bias voltage or a bias current. The third biasing signal may be different from the second biasing signal. In particular, the third biasing signal may be less than the second biasing signal.

The first biasing signal, the second biasing signal, and the third biasing signal may be derived from respective current sources 612, 618, 622a-622b powered by voltage from a battery (Vbatt) and respectively coupled to the first common base biasing component 610, the second common base biasing component 616, and the common emitter biasing components 620a-620b.

Figure 7:
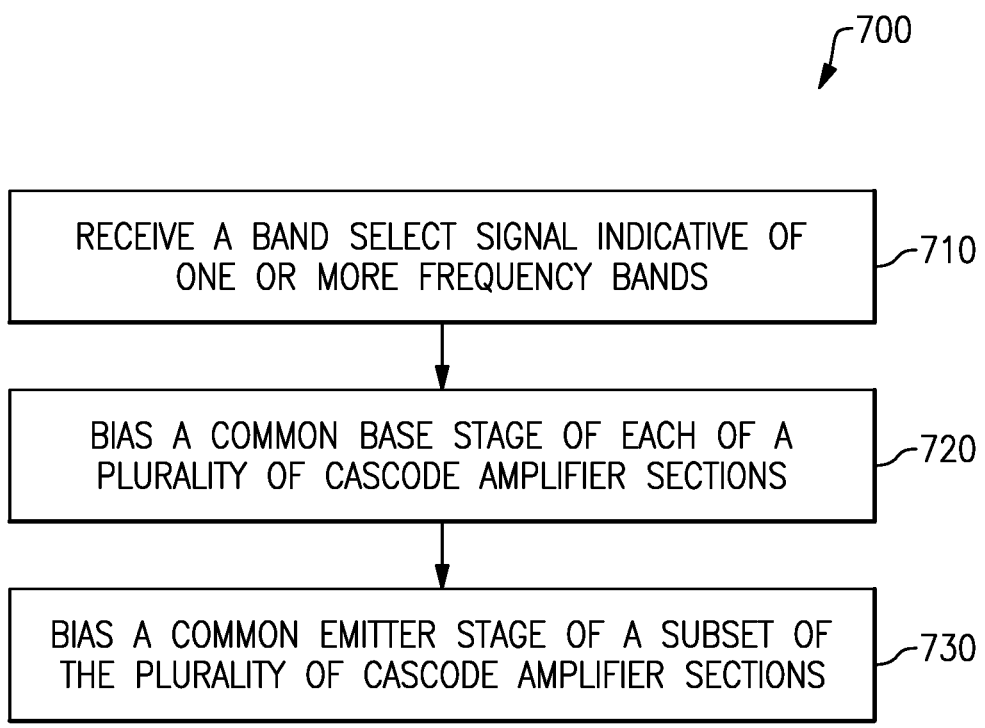
FIG. 7 shows a flowchart representation of a method of processing an RF signal.

FIG. 7 shows a flowchart representation of a method of processing an RF signal. In some implementations (and as detailed below as an example), the method 700 is at least partially performed by a controller, such as the controller 590 of FIG. 5. In some implementations, the method 700 is at least partially performed by processing logic, including hardware, firmware, software, or a combination thereof. In some implementations, the method 700 is at least partially performed by a processor executing code stored in a non-transitory computer-readable medium (e.g., a memory).

The method 700 begins, at block 710, with the controller receiving a band select signal indicative of one or more frequency bands of a radio-frequency (RF) input signal to be amplified and transmitted.

At block 720, the controller biases a common base stage of each of a plurality of cascode amplifier sections. The controller can bias the common base stage of each of the plurality of cascode amplifier sections by sending a control signal to common base biasing component coupled to common base stage of each of the plurality of cascode amplifier sections. In some implementations, the controller receives a signal indicative of a target output power and biases the common base stage of each of the plurality of cascode amplifier sections based on the target output power.

At block 730, the controller biases the common emitter stage of a subset of the cascode amplifier sections, each of the subset of the cascode amplifier sections corresponding to one of the one or more frequency bands indicated by the band select signal. In some implementations, the subset can include a single one of the cascode amplifier sections. In some implementations, the subset can include all of the cascode amplifier sections. The controller can bias the common emitter stage of the subset of the cascode amplifier sections by sending respective control signals to respective common emitter biasing components coupled to the common emitter stage of the subset of the cascode amplifier sections. As noted above, in some implementations, the controller receives a signal indicative of a target output power and biases the common emitter stage of each of the subset of the plurality of cascode amplifier sections based on the target output power.

With the common base stage of each of the plurality of cascode amplifier sections and the common emitter stage of a subset of the plurality of cascode amplifier sections biased by the controller, the cascode amplifier sections amplify an input RF signal (or frequency components thereof) and produce an output RF signal (of frequency components thereof that can be combined and transmitted via an antenna).

Figure 8:
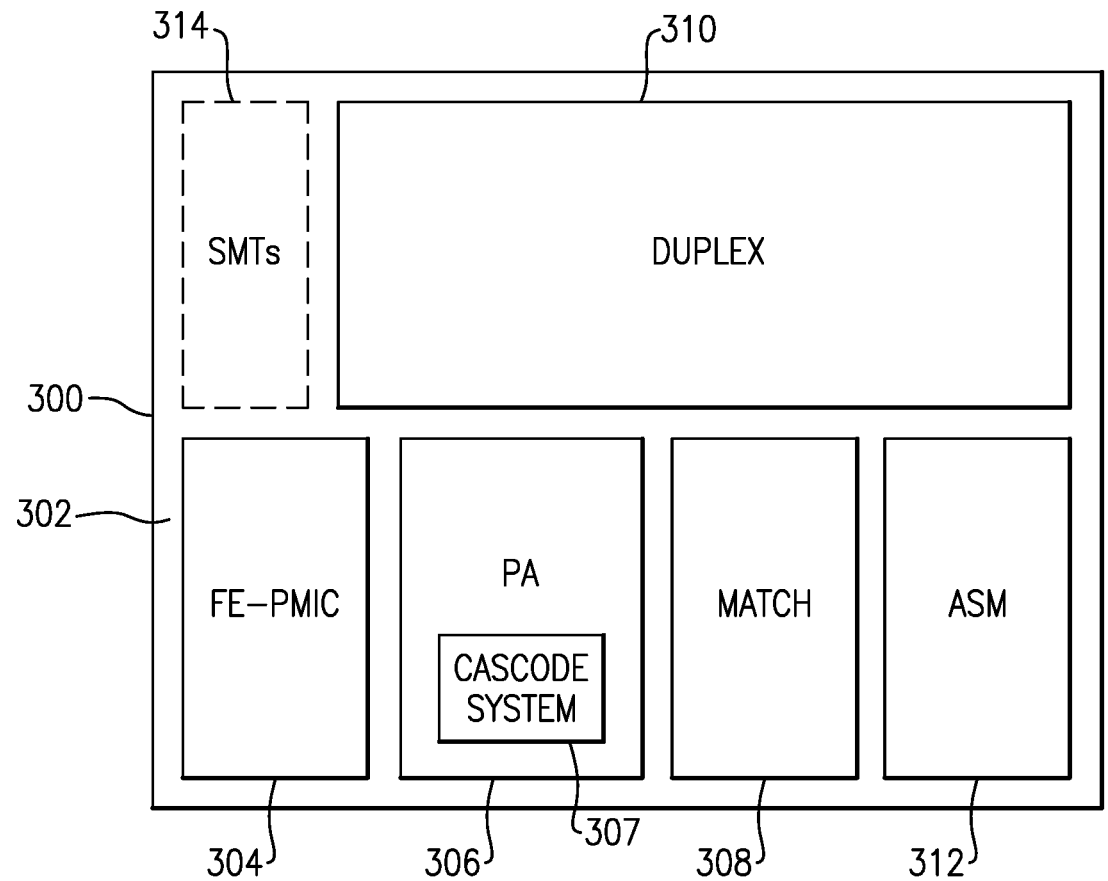
FIG. 8 depicts a module having one or more features as described herein.

FIG. 8 shows that in some embodiments, some or all of power amplification systems (e.g., that shown in FIG. 5) can be implemented in a module. Such a module can be, for example, a front-end module (FEM). In the example of FIG. 8, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. The power amplifier assembly 306 may include a cascode system 307 such as that shown in FIG. 5. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 9:
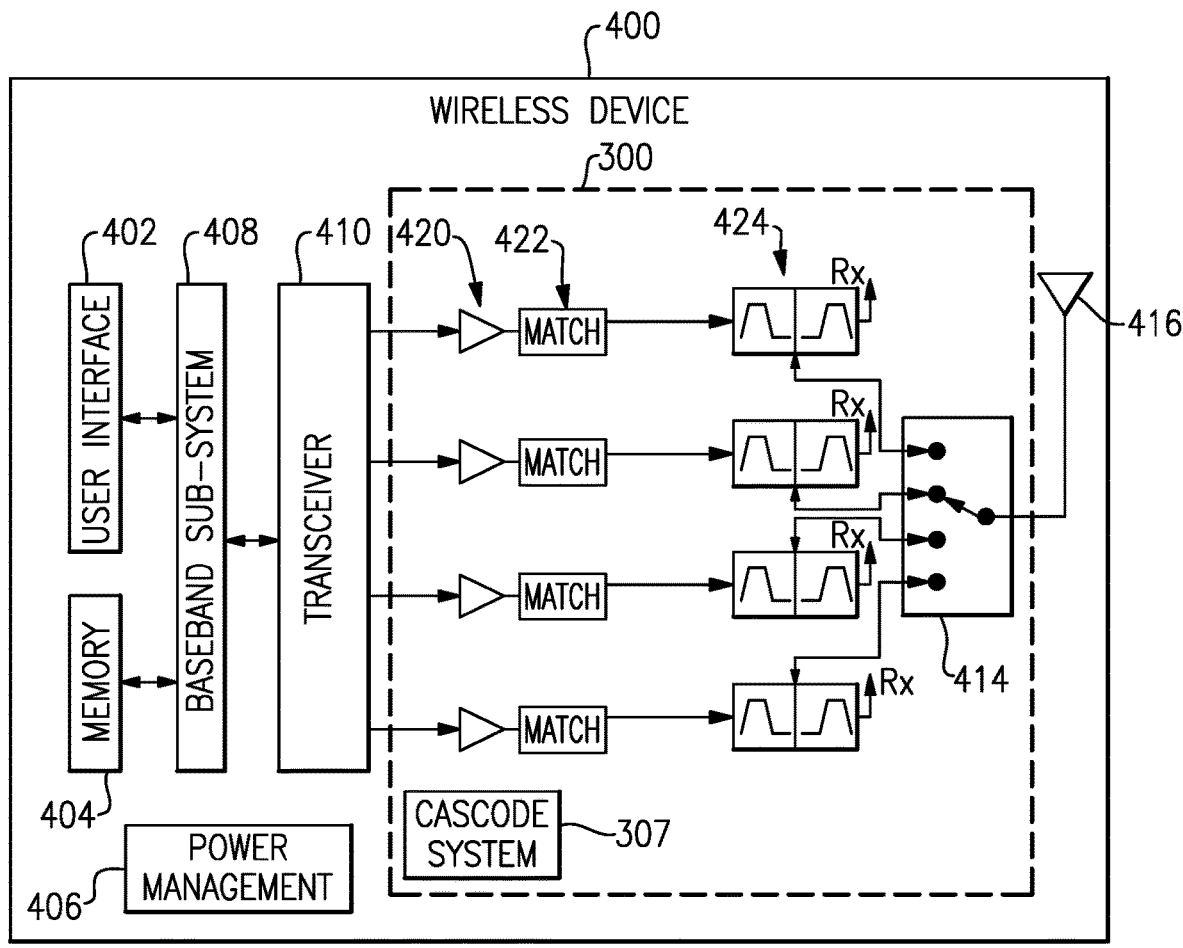
FIG. 9 depicts a wireless device having one or more features described herein.

FIG. 9 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 9, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. The power amplifiers 420 may be part of a cascode system 307 such as that shown in FIG. 5. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 7, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 9. For example, the features may be implemented to reduce buffer circuit area, control circuit area and/or complexity, and signal routing. Additional advantages may exist as the cascode bias voltage may remain active and improve isolation between the cascode amplifier sections.

Although described above primarily in the context of cascode amplifier sections, one or more features of the present disclosure can be provide advantages in other power amplification systems. For example, in some implementations, a power amplification system can include a plurality of multi-stage power amplifiers including a first transistor (e.g., of a driver stage) and a second transistor (e.g., of an output stage). The power amplification system can include separate biasing components for the first transistors and a shared biasing component for the second transistors.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of power amplification at a controller of a power amplification system comprising a plurality of cascode amplifier sections, the method comprising:
    receiving a band select signal indicative of one or more frequency bands of a radio-frequency input signal to be amplified and transmitted;
    receiving a signal indicative of a target output power;
    biasing a common base stage of each of the plurality of cascode amplifier sections based on the received signal indicative of the target output power; and
    biasing a common emitter stage of a subset of the plurality of cascode amplifier sections.

2. The method of claim 1 further comprising biasing the common emitter stage of each of the subset of cascode amplifier sections based on the received band select signal.

3. The method of claim 2 wherein each of the subset of the cascode amplifier sections corresponds to one of the one or more frequency bands indicated by the received band select signal.

4. The method of claim 2 further comprising biasing the common emitter stage of each of the subset of cascode amplifier sections based on the received signal indicative of the target output power.

5. The method of claim 2 wherein biasing the common emitter stage of each of the subset of cascode amplifier sections includes sending a respective control signal to a respective common emitter biasing component coupled to a respective common emitter stage of each respective one of the subset of cascode amplifier sections.

6. The method of claim 5 wherein sending the respective control signal to the respective common emitter biasing component includes enabling the respective common emitter biasing component to provide a respective first biasing signal to a base of a first transistor of a respective one or more of the plurality of cascode amplifier sections, based on the received band select signal.

7. The method of claim 6 wherein:
biasing the common base stage of each of the plurality of cascode amplifier sections includes sending a control signal to a common base biasing component coupled to a respective common base stage of each respective one of the plurality of cascode amplifier sections; and
sending the control signal to the common base biasing component includes enabling the common base biasing component to provide a second biasing signal to a base of a second transistor of each of the plurality of cascode amplifier sections, irrespective of the received band select signal.

8. The method of claim 7 wherein the second biasing signal is derived from a current source coupled to the common base biasing component and powered by voltage from a battery.

9. The method of claim 7 wherein the first biasing signal is derived from respective current sources coupled to the one or more of the plurality of common emitter biasing components and powered by voltage from a battery.

10. The method of claim 7 wherein a collector of the second transistor of each of the plurality of cascode amplifier sections is coupled to a supply voltage via a respective inductor.

11. The method of claim 7 wherein a collector of the second transistor of each of the plurality of cascode amplifier sections is coupled to an antenna switch component via a respective output matching and filtering component.

12. The method of claim 11 wherein each of the plurality of output matching and filtering components corresponds to a respective one of a plurality of frequency bands.

13. The method of claim 11 wherein each of the plurality of matching and filtering components is configured to filter an output radio-frequency signal with a filter centered at a respective one of a plurality of frequency bands.

14. A method of power amplification at a controller of a power amplification system comprising a plurality of cascode amplifier sections, the method comprising:
receiving a band select signal indicative of one or more frequency bands of a radio-frequency input signal to be amplified and transmitted;
biasing a common base stage of each of the plurality of cascode amplifier sections; and
biasing a common emitter stage of a subset of the plurality of cascode amplifier sections, the biasing the common emitter stage of each of the subset of cascode amplifier sections including sending a respective control signal to a respective common emitter biasing component coupled to a respective common emitter stage of each respective one of the subset of cascode amplifier sections.

15. The method of claim 14 wherein sending the respective control signal to the respective common emitter biasing component includes enabling the respective common emitter biasing component to provide a respective first biasing signal to a base of a first transistor of a respective one or more of the plurality of cascode amplifier sections, based on the received band select signal.

16. The method of claim 15 wherein:
biasing the common base stage of each of the plurality of cascode amplifier sections includes sending a control signal to a common base biasing component coupled to a respective common base stage of each respective one of the plurality of cascode amplifier sections; and
sending the control signal to the common base biasing component includes enabling the common base biasing component to provide a second biasing signal to a base of a second transistor of each of the plurality of cascode amplifier sections, irrespective of the received band select signal.

17. The method of claim 16 wherein the first biasing signal is based on a target output power.

18. The method of claim 16 wherein the second biasing signal is based on a target output power.

19. A power amplification system comprising:
a plurality of cascode amplifier sections, each one of the plurality of cascode amplifier sections including a first transistor and a second transistor;
a plurality of common emitter biasing components, each one of the plurality of common emitter biasing components coupled to a base of the first transistor of a respective one of the plurality of cascode amplifier sections and controllable to bias the first transistor of the respective one of the plurality of cascode amplifier sections;
a common base biasing component coupled to a base of the second transistor of each of the plurality of cascode amplifier sections and controllable to bias the second transistor of each of the plurality of cascode amplifier sections; and
a plurality of input matching components coupled to the base of the first transistor of a respective one of the plurality of cascode amplifier sections and configured to match an input radio-frequency signal at a respective one of a plurality of frequency bands.

20. The power amplification system of claim 19 further comprising a plurality of RC decoupling components, each one of the RC decoupling components including a resistor coupled between a respective common emitter biasing component and the base of the first transistor of a respective one of the plurality of cascode amplifier sections and further including a capacitor coupled between the base of the first transistor of the respective one of the plurality of cascode amplifier sections and a respective one of the plurality of input matching components.

* * * * *